(12) United States Patent
Chuang et al.

(10) Patent No.: US 11,348,873 B2
(45) Date of Patent: May 31, 2022

(54) WAFER STACKING METHOD AND WAFER STACKING STRUCTURE

(71) Applicant: Changxin Memory Technologies, Inc., Anhui (CN)

(72) Inventors: Ling-Yi Chuang, Hefei (CN); Shu-Liang Ning, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 15 days.

(21) Appl. No.: 17/102,182

(22) Filed: Nov. 23, 2020

(65) Prior Publication Data

US 2021/0074644 A1     Mar. 11, 2021

Related U.S. Application Data

(63) Continuation of application No. PCT/CN2019/110399, filed on Oct. 10, 2019.

(30) Foreign Application Priority Data

Nov. 1, 2018 (CN) .......................... 201811295887.6
Nov. 1, 2018 (CN) .......................... 201821793680.7

(51) Int. Cl.
    *H01L 21/50*          (2006.01)
    *H01L 23/538*        (2006.01)
    (Continued)

(52) U.S. Cl.
    CPC .......... *H01L 23/5384* (2013.01); *H01L 21/50* (2013.01); *H01L 24/94* (2013.01); *H01L 25/0657* (2013.01); *H01L 25/50* (2013.01)

(58) Field of Classification Search
CPC ...... H01L 23/5384; H01L 21/50; H01L 24/94
See application file for complete search history.

(56) References Cited

U.S. PATENT DOCUMENTS 8,586,450 B2   11/2013   Saugier
9,793,243 B2 *   10/2017   Lu .......................... H01L 23/528
(Continued)

FOREIGN PATENT DOCUMENTS

CN     102254858 A     11/2011
CN     103930988 A     7/2014
(Continued)

OTHER PUBLICATIONS

PCT International Search Report and the Written Opinion dated Jan. 14, 2020, issued in related International Application No. PCT/CN2019/110399 (8 pages).

*Primary Examiner* — Thao P Le
(74) *Attorney, Agent, or Firm* — Sheppard Mullin Richter & Hampton LLP (57) ABSTRACT

A wafer stacking method and structure are provided. The wafer stacking method includes: providing a first wafer having an upper surface comprising a first bonding pad configured to connect to a first signal; fabricating a first lower redistribution layer (RDL) and a first upper RDL on the first wafer, with the first lower RDL including a first wiring connected to the first bonding pad, the first upper RDL including a second wiring connected to the first wiring, and the second wiring having a first landing pad; bonding a second wafer on the first upper RDL, wherein an upper surface of the second wafer includes a second bonding pad configured to connect to a second signal and located corresponding to the first bonding pad; and fabricating a first through silicon via (TSV) connected to the first landing pad. The wafer stacking method improves the manufacturing yield of a die.

16 Claims, 7 Drawing Sheets

(51) Int. Cl.
    *H01L 23/00*    (2006.01)
    *H01L 25/065*   (2006.01)
    *H01L 25/00*    (2006.01)

(56) References Cited

U.S. PATENT DOCUMENTS

| | | | |
|---|---|---|---|
| 9,837,344 B2* | 12/2017 | Haba | H01L 21/4857 |
| 2013/0214423 A1 | 8/2013 | Sadaka | |
| 2021/0202448 A1* | 7/2021 | Chuang | H01L 23/544 |
| 2021/0242118 A1* | 8/2021 | Song | H05K 1/112 |
| 2021/0265274 A1* | 8/2021 | Joo | H01L 21/6835 |
| 2021/0343634 A1* | 11/2021 | Choi | H01L 23/49822 |
| 2022/0005820 A1* | 1/2022 | Kim | H01L 27/11526 |

FOREIGN PATENT DOCUMENTS

| | | |
|---|---|---|
| CN | 105336578 A | 2/2016 |
| CN | 208954984 U | 6/2019 |
| CN | 209401620 U | 9/2019 |

\* cited by examiner

| fabricate a second lower RDL on the second wafer, and fabricate a third wiring connected to the TSV and a fourth wiring connected to the second bonding pad in the second lower RDL | — S110 |

↓

| fabricate a second upper RDL on the second lower RDL, and fabricate a fifth wiring connected to the third wiring and a sixth wiring connected to the fourth wiring in the second upper RDL, so as to respectively form a second landing end electrically connected to the first signal, and a third landing end electrically connected to the second signal | — S112 |

WAFER STACKING METHOD AND WAFER STACKING STRUCTURE

CROSS-REFERENCE TO RELATED APPLICATION

This application is a continuation application of International Patent Application No. PCT/CN2019/110399, filed on Oct. 10, 2019, which is based on and claims priority of the Chinese Patent Application No. 201811295887.6, filed on Nov. 1, 2018 and entitled "WAFER STACKING METHOD AND WAFER STACKING STRUCTURE." The above-referenced application is incorporated herein by reference in its entirety.

TECHNICAL FIELD

The present invention relates generally to the technical field of integrated circuit (IC) manufacturing, and more specifically, to a wafer stacking method capable of improving electrical connections between dies and a wafer stacking structure fabricated by using the wafer stacking method, and a die stacking structure.

BACKGROUND

Figure 1A:
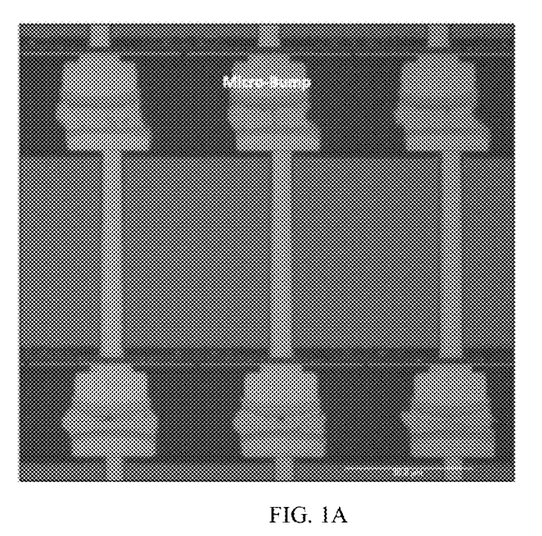
FIGS. 1A and 1B show schematic diagrams of a die stacking structure in the related art.
Figure 1B:
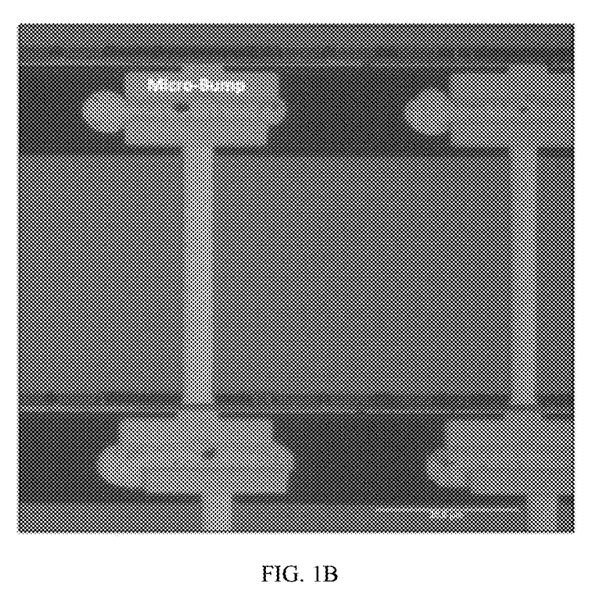

In an IC manufacturing process, by stacking multiple dies and establishing mechanical and electrical connection thereon, the size of an IC may be reduced. As shown in FIGS. 1A and 1B, in existing practices, a through silicon via (TSV) may first be fabricated for each to-be-stacked die, then a micro bump may be formed for each TSV. Last, the dies may be bonded together through die-to-die or die-to-wafer bonding, and inter-layer electrical connections may be established through the micro bumps and TSV.

The die-to-die or die-to-wafer bonding process, however, has a low efficiency, which drives up the cost. Additionally, the TSV and the micro bumps need to be fabricated for each die in advance, and the risks associated with a positioning or connection error in the bonding process are substantial. The electrical connection path between dies located on different layers may be easily disrupted. All of these may reduce the production yield.

Therefore, a die stacking method that can address the aforementioned issues is desired.

It is to be noted that the information disclosed in the above background is merely for facilitating understanding the background of the present invention, and thus may include information that does not constitute prior art known to a person of ordinary skill in the art.

SUMMARY

In view of the limitations of existing technologies described above, the present invention provides a wafer stacking method and a wafer stacking structure, which address the aforementioned issues in existing technologies, including high die stacking cost, susceptibility to connection error, and low production yield.

One aspect of the present invention is directed to a wafer stacking method. The method may include: providing a first wafer; and sequentially fabricating a first lower redistribution layer (RDL) and a first upper RDL on the first wafer. An upper surface of the first wafer may include a first bonding pad configured to connect a first signal. The first lower RDL may include a first wiring connected to the first bonding pad, the first upper RDL may include a second wiring connected to the first wiring, and the second wiring may have a first landing pad.

The method may further include: bonding a second wafer on the first upper RDL; and fabricating a first through silicon via (TSV) with a bottom connected to the first landing pad at a position of the second wafer corresponding to the first landing pad. An upper surface of the second wafer may include a second bonding pad configured to connect to a second signal and located corresponding to the first bonding pad.

In some embodiments of the present invention, the fabricating a first TSV with a bottom connected to the first landing pad may include: fabricating a through via at the position of the second wafer corresponding to the first landing pad, wherein a bottom of the through via may expose the first landing pad; and filling a conductive material into the through via. The conductive material may include a metal.

In some embodiments of the present invention, the aforementioned method may further include: fabricating a groove configured to form a second lower RDL while fabricating the through via.

In some embodiments of the present invention, any one of the aforementioned methods may further include: sequentially fabricating the second lower RDL and a second upper RDL on the second wafer. The second lower RDL may include a third wiring connected to the first TSV and a fourth wiring connected to the second bonding pad, the second upper RDL may include a fifth wiring connected to the third wiring and a sixth wiring connected to the fourth wiring, and the fifth wiring and the sixth wiring may include a second landing pad and a third landing pad, respectively.

In some embodiments of the present invention, a first distance between the first landing pad and the first bonding pad in a horizontal direction may be equal to a third distance between the third landing pad and the first bonding pad in the horizontal direction, and neither the first distance or the third distance may be zero.

Another aspect of the present invention is directed to a wafer stacking structure. The structure may include: a first wafer, having an upper surface including a first bonding pad configured to connect a first signal; a first lower RDL, located on the first wafer and including a first wiring electrically connected to the first bonding pad; a first upper RDL, located on the first lower RDL and including a second wiring electrically connected to the first wiring, with the second wiring having a first landing pad; a second wafer, having a bottom bonded on the first upper RDL and including a second bonding pad configured to connect to a second signal and a first TSV with a bottom directly connected to the first landing pad; a second lower RDL, located on the second wafer and including a third wiring electrically connected to the first TSV and a fourth wiring electrically connected to the second bonding pad; and a second upper RDL, located on the second lower RDL and including a fifth wiring electrically connected to the third wiring and a sixth wiring electrically connected to the fourth wiring. The fifth wiring and the sixth wiring may include a second landing pad and a third landing pad, respectively.

In some embodiments of the present invention, a first distance between the first landing pad and the first bonding pad in a horizontal direction may be equal to a third distance between the third landing pad and the first bonding pad in the horizontal direction, and neither the first distance or the third distance may be zero.

Another aspect of the present invention is directed to a die stacking method. The method may include: providing the wafer stacking structure according to any of the aforementioned embodiments; and scribing and cutting the wafer stacking structure to form a preset number of dies each having a stacking structure.

Another aspect of the present invention is directed to a die stacking structure. The structure may include: a first die, having an upper surface including a first bonding pad configured to connect to a first signal; a first RDL, located on the first die and including a first wiring electrically connected to the first bonding pad; a first upper RDL, located on the first lower RDL and including a second wiring electrically connected to the first wiring, with the second wiring having a first landing pad; a second die, having a bottom bonded on the first upper RDL and including a second bonding pad configured to connect to a second signal and a first TSV with a bottom directly connected to the first landing pad; a second lower RDL, located on the second die and including a third wiring electrically connected to the first TSV and a fourth wiring electrically connected to the second bonding pad; and a second upper RDL, located on the second lower RDL and including a fifth wiring electrically connected to the third wiring and a sixth wiring electrically connected to the fourth wiring. The fifth wiring and the sixth wiring may include a second landing pad and a third landing pad, respectively.

In some embodiments of the present invention, a first distance between the first landing pad and the first bonding pad in a horizontal direction may be equal to a third distance between the third landing pad and the first bonding pad in the horizontal direction, and neither the first distance or the third distance may be zero.

Another aspect of the present invention is directed to a die stacking structure. The structure may include a base die structure and a plurality of upper die structures stacked over the base die structure. The base die structure may include a die, having an upper surface comprising a bonding pad configured to connected to a signal; a lower redistribution layer (RDL), located on the die and comprising a first wiring electrically connected to the bonding pad; and an upper RDL, located on the lower RDL and comprising a second wiring electrically connected to the first wiring, the second wiring having a landing pad.

Each of the plurality of upper die structures may include: a die, having a bottom bonded with the upper RDL of the die structure underneath, and a through silicon via (TSV) with a bottom directly connected to the landing pad of the die structure underneath; a lower RDL, located on the die and comprising a first wiring electrically connected to the TSV; and an upper RDL, located on the lower RDL and comprising a second wiring electrically connected to the first wiring of the lower RDL, wherein the second wiring comprises a landing pad. The signal in the die of the base die structure may be guided out to the landing pad of the uppermost upper die structure through N TSVs. N is the number of upper die structures in the plurality of upper die structures.

According to the wafer stacking method provided by the embodiment of the present invention, wafers are first bonded together before TSVs are formed, and signal connections between wafers are established via two RDLs. Thus the errors related to mechanical alignment and electrical connection of the TSVs in the related art may be reduced. Signals on a bonding pad at corresponding positions on different layers of wafers may be obtained by simply establishing mechanical connection between the wafers, so the issues related to the electrical connection of the TSV through a micro bump may be reduced. Thus, the manufacturing cost may be lowered, and the production yield may be improved.

It is to be understood that both the foregoing general description and the following detailed description are exemplary and explanatory only and are not necessarily restrictive to the present invention.

BRIEF DESCRIPTION OF THE DRAWINGS

The accompanying drawings, which are incorporated in and constitute a part of the specification, illustrate embodiments of the present invention and together with the specification, serve to explain the principles of the present invention. Apparently, the accompanying drawings in the following description are only some embodiments of the present invention, and a person of ordinary skill in the art can derive other drawings from the accompanying drawings without creative efforts.

DETAIL DESCRIPTION OF THE EMBODIMENTS

The exemplary embodiments will be described more completely in conjunction with the accompanying drawings. However, the exemplary embodiments can be implemented in various forms, and should not be understood as being limited to the embodiments described herein. Instead, these embodiments are provided to make the present invention thorough and complete, and convey the concepts of the exemplary embodiments to a person skilled in the art fully. The described characteristics, structures or properties may be combined in one or more embodiment in any appropriate manner. In the following description, many particular details are provided to give a full understanding on the embodiments of the present invention. However, it would be appreciated by the person skilled in the art that one or more of the particular details may be omitted by the practice of the technical solutions of the present invention, or other methods, components, apparatuses, steps and the like may be adopted. In other cases, the known technical solutions are not illustrated or described in detail to prevent distracting and making aspects of the present invention obscure.

Additionally, the accompanying drawings are merely schematic diagrams of the present invention. In the accompanying drawings, identical reference signs represent identical or similar parts, and therefore, the descriptions thereof are omitted. Some block diagrams in the accompanying drawings are functional entities, which do not necessarily correspond to physically or logically independent entities. These functional entities may be implemented in a software form, or implemented in one or more hardware modules or integrated circuits, or implemented in different networks and/or processor apparatuses and/or microcontroller apparatuses.

The embodiments of the present invention will be described below in detail with reference to the accompanying drawings.

Figure 2:
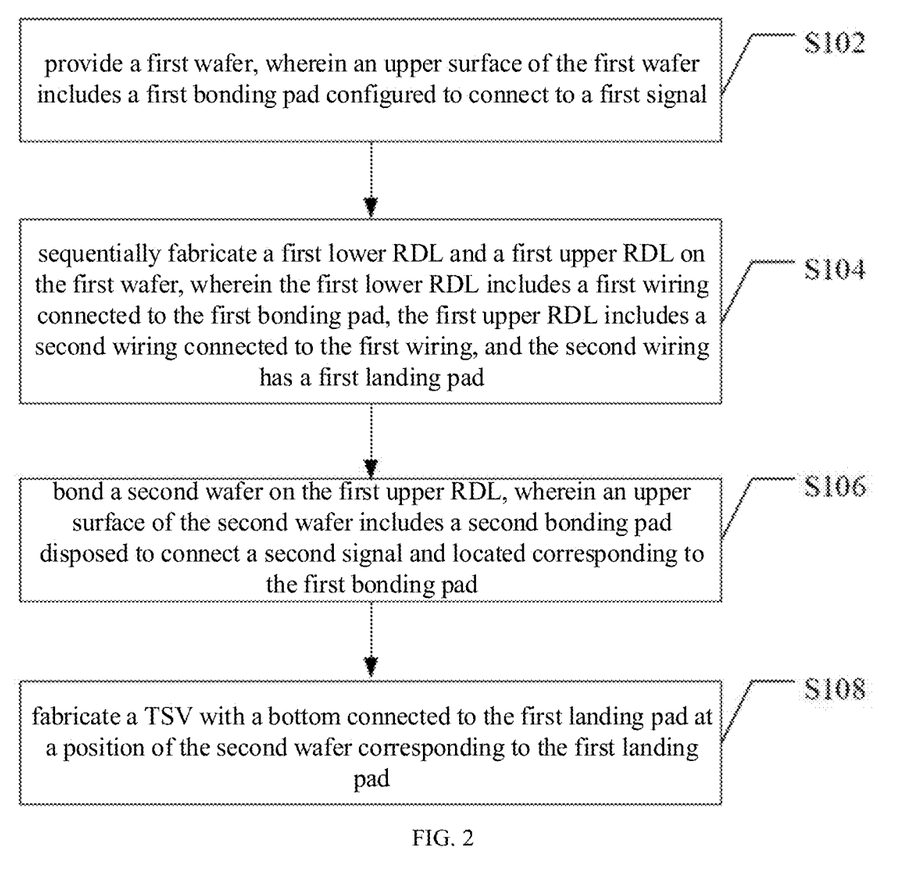
FIG. 2 shows a flowchart illustrating a wafer stacking method in accordance with one embodiment of the present invention.

FIG. 2 shows a flowchart illustrating a wafer stacking method in accordance with one embodiment of the present invention. Referring to FIG. 2, the wafer stacking method may include the following steps S102 through S108.

In step S102, a first wafer is provided. An upper surface of the first wafer may include a first bonding pad configured to connect to a first signal.

In step S104, a first lower RDL and a first upper RDL may be sequentially fabricated on the first wafer. The first lower RDL may include a first wiring connected to the first bonding pad, the first upper RDL may include a second wiring connected to the first wiring, and the second wiring may have a first landing pad.

In step S106, a second wafer may be bonded on the first upper RDL. An upper surface of the second wafer may include a second bonding pad configured to connect to a second signal and located corresponding to the first bonding pad.

In step S108, a first TSV may be fabricated with a bottom connected to the first landing pad at a position of the second wafer corresponding to the first landing pad.

FIGS. 3A, 3B, 3C, and 3D show schematic diagrams of die stacking structures fabricated with a wafer stacking method shown in FIG. 2.

Figure 3A:
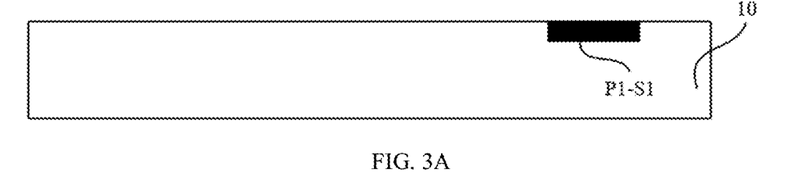
FIGS. 3A, 3B, 3C, and 3D show schematic diagrams of wafer stacking structures formed by a wafer stacking method in accordance with one or more embodiments of the present invention.

FIG. 3A shows a first wafer 1 provided by the step S102. An upper surface of the first wafer 1 may include a first bonding pad P1-S1 configured to connect to a first signal S1.

Figure 3B:
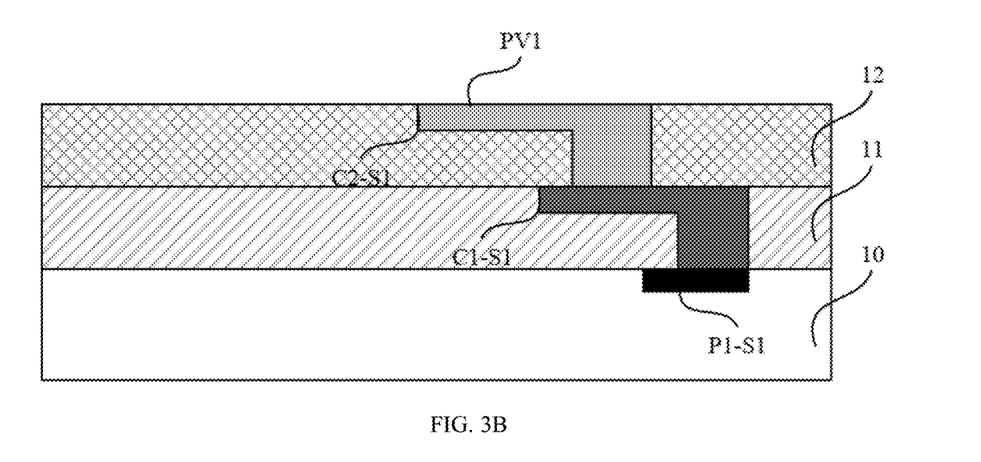

FIG. 3B is a schematic diagram of fabricating a first lower RDL 11 and a first upper RDL 12 on the first wafer 10 in the step S104. The first lower RDL 11 may include a first wiring C1-S1 connected to the first bonding pad P1-S1, the first upper RDL 12 may include a second wiring C2-S1 connected to the first wiring C1-S1, and the second wiring may include a first landing pad PV1 located on an upper surface of the first upper RDL 12. The first wiring and the second wiring may be, for example, a metal.

Although FIGS. 3A, 3B, 3C, and 3D illustrate an embodiment in which a first wafer 10 does not include a TSV, it may be understood that the first wafer 10 in other embodiments may include a TSV electrically connected to other signals, and correspondingly, the first lower RDL and the first upper RDL may include a wiring and a landing pad connected to the other signals.

In the embodiment shown in FIG. 3B, a distance (i.e., a first distance) between the first landing pad PV1 and the first bonding pad P1-S1 in a horizontal direction may be denoted as L1, and L1≠0. Relative positions and directions of the first landing pad PV1 and the first bonding pad P1-S1 may be determined according to specific requirements, and this invention is not limited in this regard.

Figure 3C:
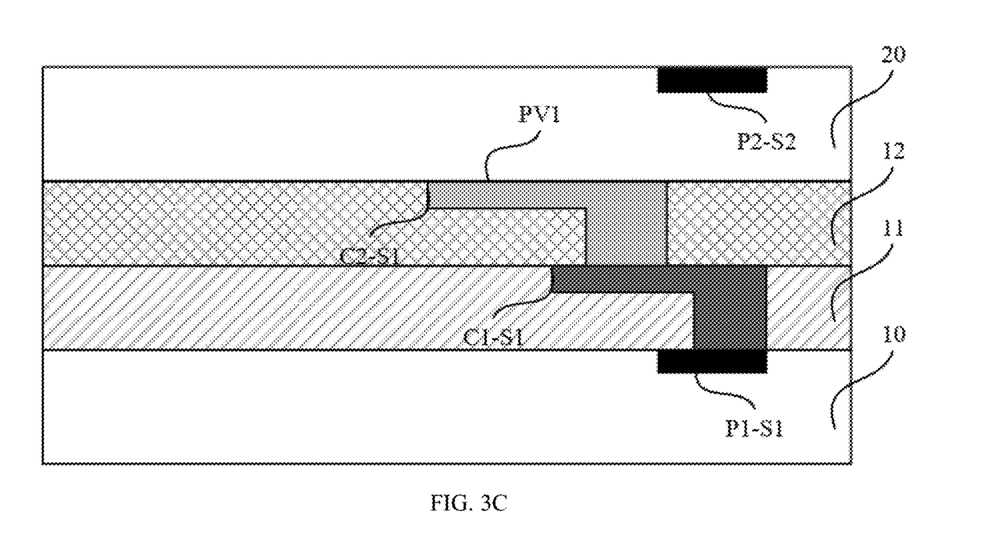

FIG. 3C is a schematic diagram of bonding a second wafer 20 on the first upper RDL 12 in step S106. An upper surface of the second wafer 20 may include a second bonding pad P2-S2 configured to connect to a second signal S2 and located corresponding to the first bonding pad P1-S1.

It may be understood by the person skilled in the art that the bonding process may include the steps of first performing chemical mechanical polishing (CMP) on an upper surface of the first upper RDL 12, then using a plasma to activate the surface of the first upper RDL 12, and then bonding the second wafer 20 on the activated surface. Detail implementations of these processes will not be described herein for the sake of conciseness.

In the embodiment shown in FIG. 3C, a structure for isolating the second wiring C2-S1 and the second wafer 20 may be provided between the second wafer 20 and the first upper RDL 12. For example, the isolation between the second wiring C2-S1 and the second wafer 20 may be implemented by growing an oxidation layer or other insulation layers on the upper surface of the first upper RDL 12. In some embodiments, the second wiring C2-S1 may be manufactured to be lower than the upper surface of the first upper RDL 12 during manufacturing. That may be made by, for example, fabricating the second wiring C2-S1 with a damascene process, followed by depositing a medium material of the first upper RDL 12 on the second wiring C2-S1, so that the second wiring C2-S1 is covered by the medium material with only the first landing pad PV1 exposed. In some embodiments, the second wafer 20 or a bottom part of the second wafer 20 may be insulated in advance. Various methods may be used to implement inter-layer insulation, a specific method used in an application may be determined according to an actual requirement, and this invention is not limited herein.

Figure 3D:
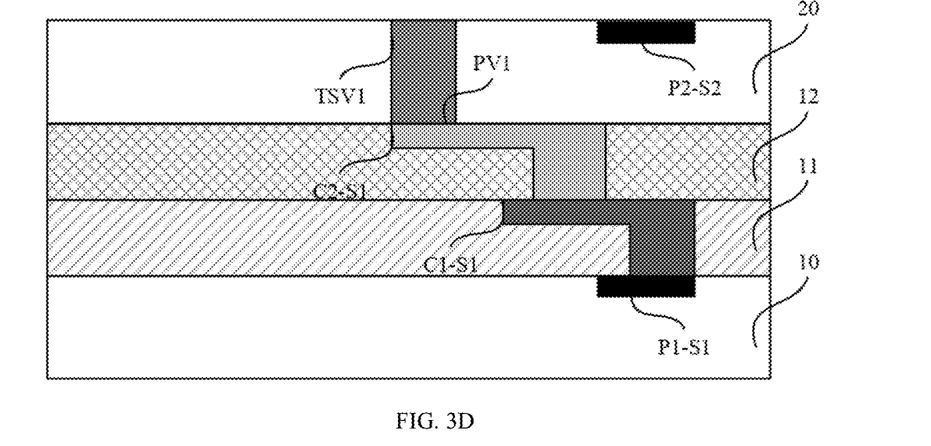

FIG. 3D is a schematic diagram of fabricating a first TSV with a bottom connected to the first landing pad at a position of the second wafer corresponding to the first landing pad in step S108. In some embodiments, the process of fabricating the first TSV may include, for example, the following steps: fabricating a through via at the position of the second wafer corresponding to the first landing pad, wherein a bottom of the through via exposes the first landing pad; and, filling a conductive material into the through via, wherein the conductive material may be, for example, a metal.

The first bonding pad may be electrically connected to the first TSV via the first wiring and the second wiring, and a signal of the first bonding pad may be guided out to the second wafer without going through a micro bump. Therefore, common problems in the die stacking process in the related art, such as material leakage, pseudo soldering and misalignment may be prevented.

Figure 4:
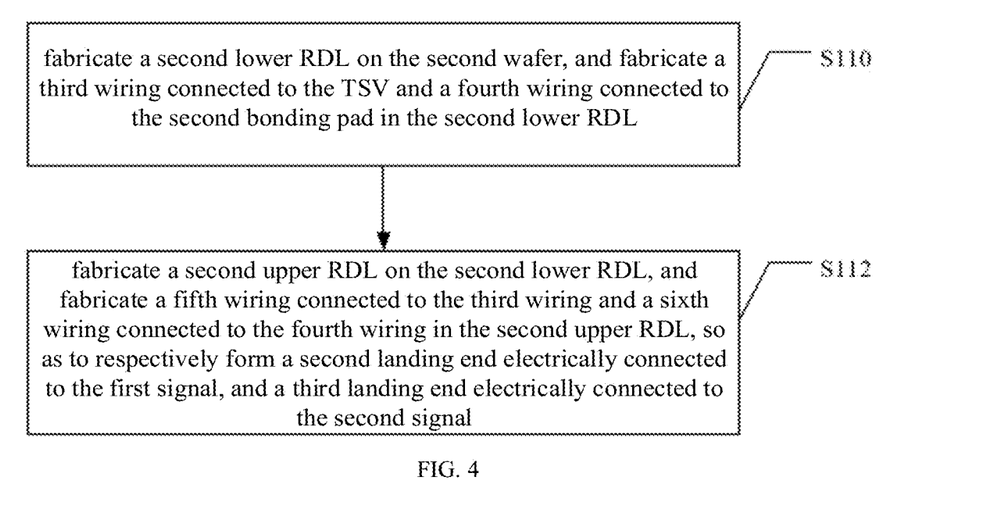
FIG. 4 shows a flowchart illustrating a wafer stacking method in accordance with one embodiment of the present invention.

Additionally, the wafer stacking method may further include steps for preparing for subsequent stacking. FIG. 4 shows a flowchart illustrating a die stacking method in accordance with one embodiment of the present invention. Referring to FIG. 4, the die stacking method may include the following steps S110 to S112.

In step S110, a second lower RDL is fabricated on the second wafer, and a third wiring connected to the first TSV and a fourth wiring connected to the second bonding pad are fabricated in the second lower RDL.

In step S112, a second upper RDL is fabricated on the second lower RDL. A fifth wiring connected to the third wiring, and a sixth wiring connected to the fourth wiring are fabricated in the second upper RDL, so as to respectively form a second landing pad electrically connected to the first signal, and a third landing pad electrically connected to the second signal.

Figure 5A:
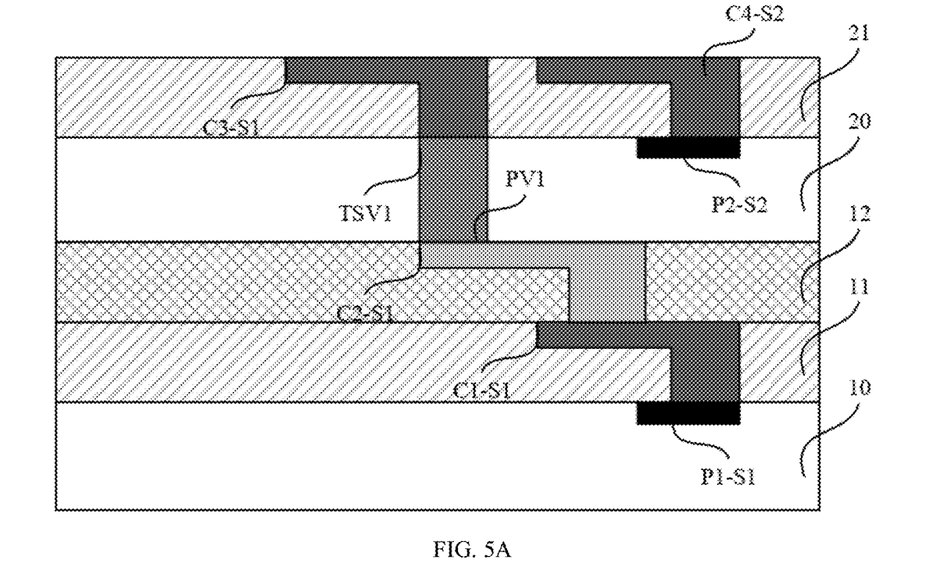
FIGS. 5A and 5B show schematic diagrams of wafer stacking structures formed by a wafer stacking method shown in FIG. 4.
Figure 5B:
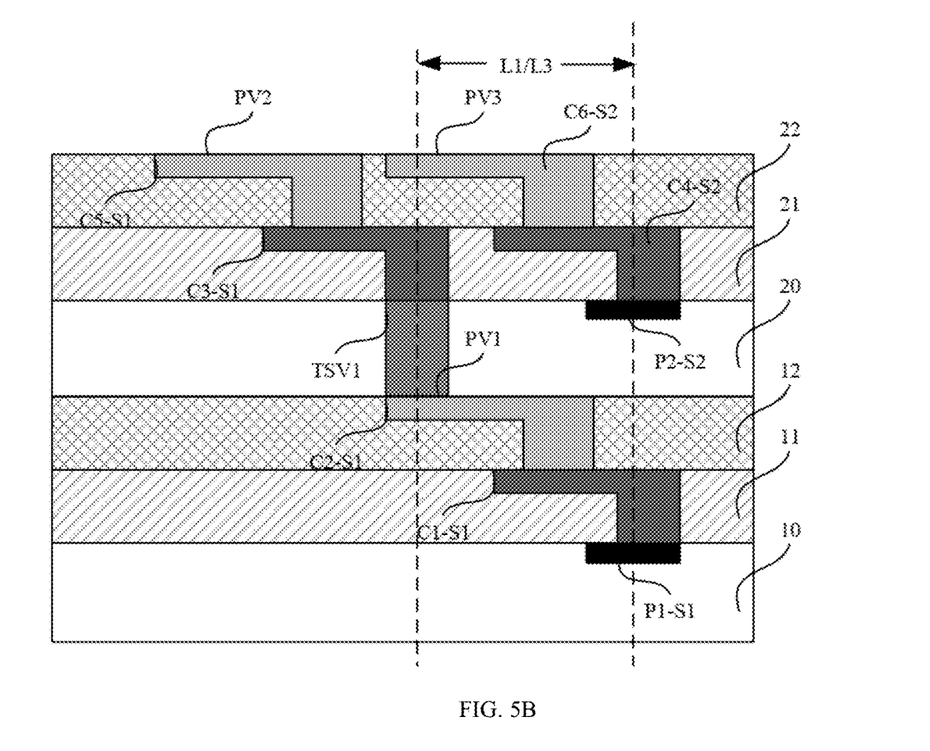

FIGS. 5A and 5B show schematic diagrams illustrating the steps shown in FIG. 4.

Referring to FIG. 5A, the processes of fabricating the second lower RDL 21, the third wiring C3-S1 and the fourth wiring C4-S2 on the second wafer 20 may include: fabricating the first TSV TSV1 on the second wafer 20, then depositing a first medium material on the second wafer 20 and the first TSV TSV1 to form the second lower RDL 21, and fabricating, in the second lower RDL 21, the third wiring C3-S1 electrically connected to the first TSV TSV1 and the fourth wiring C4-S2 electrically connected to the second bonding pad P2-S2.

Alternatively, the processes of fabricating the second lower RDL 21, the third wiring C3-S1, and the fourth wiring C4-S2 on the second wafer 20 may include: depositing a first medium material on the second wafer 20 to form the second lower RDL 21, fabricating a through via at a position of the second wafer 20 and the second lower RDL 21 corresponding to the first landing pad PV1, filling a conductive material into the through via to form the first TSV TSV1 with a bottom electrically connected to the first landing pad PV1, and fabricating the third wiring C3-S1 electrically connected to the first TSV TSV1 and the fourth wiring C4-S2 electrically connected to the welding bonding pad in the second lower RDL 21. That is, regarding the stacking for multiple layers of dies, the fabrication of the first TSV TSV1 may be done prior to the formation of the second lower RDL 21, and may also be done after the formation of the second lower RDL 21, which is not particularly limited by the present invention thereto. The first medium material may be, for example, an oxide.

Referring to FIG. 5B, to prepare for subsequent wafer stacking, a second upper RDL 22 may be formed, and, via a fifth wiring C5-S1 and a sixth wiring C6-S2 in the second upper RDL 22, a corresponding position of a landing pad connected to each signal may be adjusted, thus allowing a signal from a bonding pad on a corresponding position being guided out.

Figure 6:
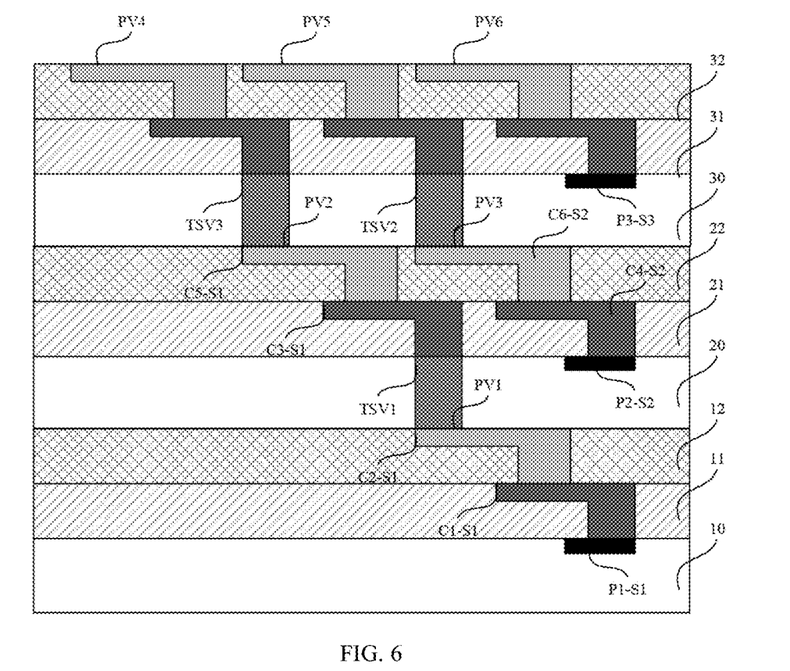
FIG. 6 shows a schematic diagram of a wafer stacking structure in accordance with one embodiment of the present invention.

As shown in FIG. 6, after the fifth wiring C5-S1 and the sixth wiring C6-S2 are fabricated, a distance L1 between the first landing pad PV1 and the first bonding pad P1-S2 in the horizontal direction may be equal to a distance L3 between the third landing pad PV3 and the first bonding pad P1-S1 in the horizontal direction, and neither the distance L1 or the distance L3 is zero. The first landing pad PV1 and the third landing pad PV3 may be aligned in this embodiment of the present invention to facilitate the stacking and signal guidance of a wafer provided with a same circuit or a same type of bonding pad. However, in other embodiments, the person skilled in the art may further stack wafers having different circuits, and adjust a position of each landing pad to provide a larger design space, which is not limited by the present invention thereto.

After dies are stacked following step S104 to step S112, a structure shown in FIG. 6 may be formed. That is, after a third wafer (having an upper surface including a third bonding pad P3-S3 connected to a third signal S3) is bonded to the second upper RDL 22, a second TSV TSV2 and a third TSV TSV3 may be fabricated, and a third lower RDL 31 and a third upper RDL 32 may be fabricated on the TSVs to form a wiring capable of guiding the signals S1, S2 and S3 connected to corresponding bonding pad to an uppermost layer (PV4, PV5, PV6). In this embodiment of the present invention, the signals S1, S2 and S3 may be, for example, a die selection (CS) signal.

Figure 7A:
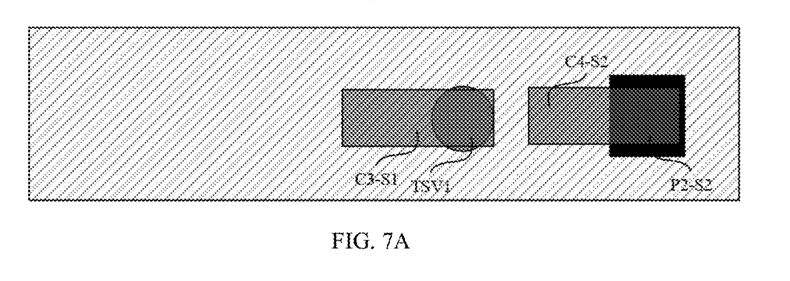
FIGS. 7A and 7B show top views of a wafer stacking structure shown in FIG. 5B.
Figure 7B:
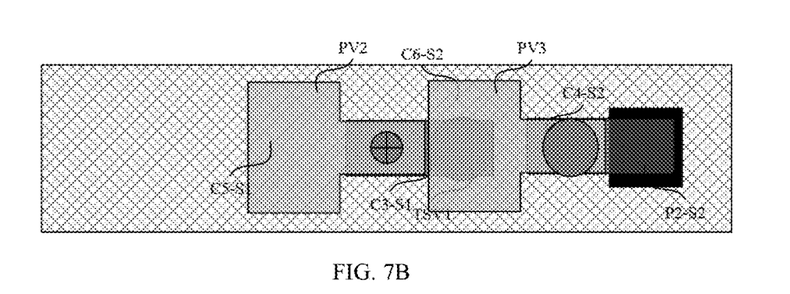

FIGS. 7A and 7B show a top view of a second lower RDL 21 and a second upper RDL 22, respectively. With reference to FIGS. 7A, 7B, and 5B, specific shape and size of each wiring on a same plane may be determined according to an actual requirement, and this invention is not limited in this regard.

In another some embodiments, a die stacking structure may be fabricated with the following steps:
1. Fabricate a first lower RDL and a first upper RDL on a first wafer to guide a signal of a first bonding pad to a first landing pad.
2. Bond a second wafer on a first upper RDL.
3. Deposit a first medium material on the second wafer to form a second lower RDL.
4. Etch a through via at a position of the second wafer and the second lower RDL corresponding to the first landing pad.
5. Etch, in the second lower RDL, a first wiring groove connected to the through via and a second wiring groove connected to a second bonding pad.
6. Fill a conductive material into the through via and the first and the second wiring grooves to form a first TSV, a third wiring electrically connected to the first TSV and a fourth wiring electrically connected to the second bonding pad.
7. Perform CMP on the second lower RDL.
8. Deposit a second medium material on the second lower RDL to form a second upper RDL.
9. Etch a wiring groove on the second upper RDL and fill the conductive material into the wiring groove to form a fifth wiring and a second landing pad electrically connected to the third wiring, and a sixth wiring and a third landing pad electrically connected to the fourth wiring.
10. Perform the CMP on the second upper RDL.

In the above process, the first medium material and the second medium material may be, for example, an oxide. The first medium material and the second medium material may be the same material or different materials.

In this embodiment of the present invention, wafers are first bonded before a TSV is fabricated, and signals from bonding pads having a same relative position in each die layer may be guided to an uppermost layer via two RDLs. Thus, the mechanical alignment and electrical connection of the TSV to a lower-layer signal may be implemented in one run. Since a micro bump is not necessary, common problems in the die stacking process in the related art, such as low production yield, may be effectively prevented, and the manufacturing cost may be lowered.

Figure 8:
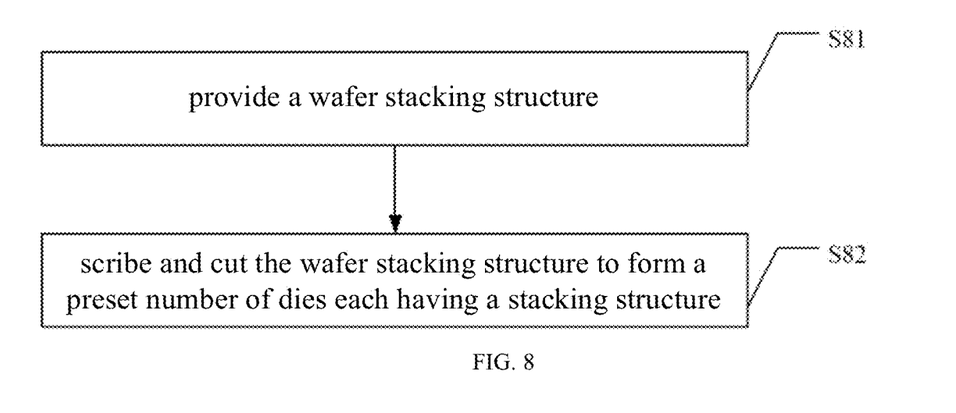
FIG. 8 shows a flowchart illustrating a die stacking method in accordance with one embodiment of the present invention.

FIG. 8 shows a flowchart illustrating a die stacking method in accordance with one embodiment of the present invention.

Referring to FIG. 8, the die stacking method may include the following steps S81 to S82.

In step S81, a wafer stacking structure may be provided. The wafer stacking structure may be the wafer stacking structure in any of the aforementioned embodiments.

In step S82, the wafer stacking structure may be scribed and cut to form a preset number of dies each having a stacking structure.

Figure 9:
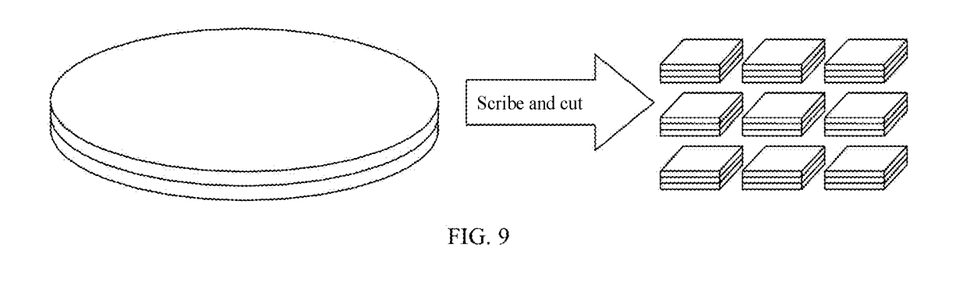
FIG. 9 shows a schematic diagram of a die stacking method shown in FIG. 8.

FIG. 9 shows a schematic diagram of a die stacking method shown in FIG. 8. As shown in FIG. 9, a wafer stacking structure fabricated according to the above method embodiment is scribed and cut to form unpackaged bare dies. It is to be noted that the wafer stacking structure provided by the present invention may include the structure shown in FIG. 3D or FIG. 5B.

Figure 10:
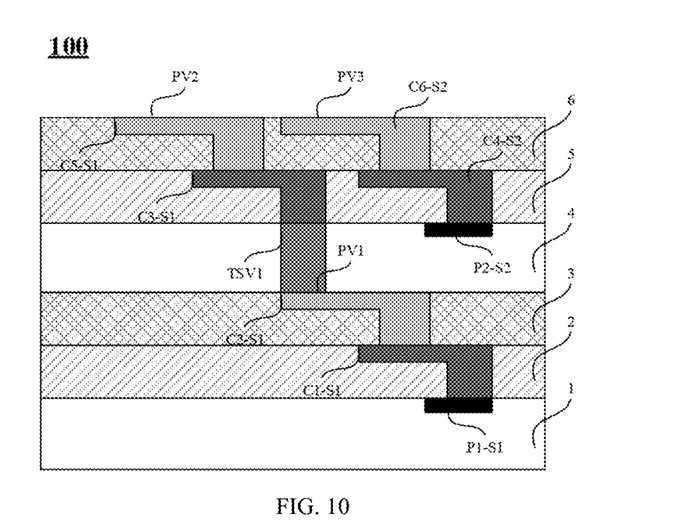
FIG. 10 shows a schematic diagram of a die stacking structure in accordance with one embodiment of the present invention.

FIG. 10 shows a schematic diagram of a die stacking structure manufactured by a method shown in FIG. 9.

Referring to FIG. 10, the die stacking structure 100 may include: a first die 1, having an upper surface including a first bonding pad P1-S1 configured to connect to a first signal S1; a first lower RDL 2, located on the first die 1 and including a first wiring C1-S1 electrically connected to the first bonding pad P1-S1; a first upper RDL 3, located on the first lower RDL 2 and including a second wiring C2-S1 electrically connected to the first wiring C1-S1, the second wiring C2-S1 having a first landing pad PV1; a second die 4, having a bottom bonded to the first upper RDL 3, and including a second bonding pad P2-S2 configured to connect to a second signal S2 and a first TSV TSV1 with a bottom directly connected to the first landing pad PV1; a second lower RDL 5, located on the second die 4, and including a third wiring C3-S1 electrically connected to the first TSV TSV1 and a fourth wiring C4-S2 electrically connected to the second bonding pad P2-S2; and a second upper RDL 6, located on the second lower RDL 5, and including a fifth wiring C5-S1 electrically connected to the third wiring C3-S1 and a sixth wiring C6-S2 electrically connected to the fourth wiring C4-S2. The fifth wiring C5-S1 and the sixth wiring C6-S2 respectively include a second landing pad PV2 and a third landing pad PV3.

Although FIG. 10 only illustrates a die stacking structure including two layers of dies, it may be understood that the person skilled in the art may set the number of layers of stacked dies according to an actual requirement based on the structure shown in FIG. 10, and the present invention is not limited in this regard.

The dies shown in FIG. 10 are not provided with a micro bump structure, and the electrical connection between the dies is implemented via an RDL, and a TSV with a bottom directly connected to the RDL. Therefore, relatively high reliability may be achieved, and common problems in the related art, such as unstable electrical connection between dies, may be prevented.

In addition, the above accompanying drawings are merely schematic descriptions for the method or apparatus according to the exemplary embodiment of the present invention and are not intended to limit the present invention. It is easily understood that the processes in the accompanying drawings does not indicate or limit a time sequence of these processes. Additionally, it is also easily understood that these processes may be, for example, executed in multiple modules synchronously or asynchronously.

Other embodiments of the present invention will be apparent to the person skilled in the art from consideration of the specification and practice of the present invention disclosed here. The present invention is intended to cover any variations, uses, or adaptations of the present invention following the general principles thereof and including such departures from the present invention as come within known or customary practice in the art. The specification and the embodiments are merely considered as being exemplary, and the real scope of the present invention is subjected to the claims.

What is claimed is:

1. A wafer stacking method, comprising:
providing a first wafer, wherein an upper surface of the first wafer comprises a first bonding pad configured to connect to a first signal;
sequentially fabricating a first lower redistribution layer (RDL) and a first upper RDL on the first wafer, wherein the first lower RDL comprises a first wiring connected to the first bonding pad, the first upper RDL comprises a second wiring connected to the first wiring, and the second wiring has a first landing pad;
bonding a second wafer on the first upper RDL, wherein an upper surface of the second wafer comprises a second bonding pad configured to connect to a second signal and located corresponding to the first bonding pad; and
fabricating, at a position of the second wafer corresponding to the first landing pad, a first through silicon via (TSV) with a bottom connected to the first landing pad.

2. The wafer stacking method of claim 1, wherein the fabricating a first TSV with a bottom connected to the first landing pad comprises:
fabricating, at the position of the second wafer corresponding to the first landing pad, a through via, wherein a bottom of the through via exposes the first landing pad; and
filling a conductive material into the through via, wherein the conductive material comprises a metal.

3. The wafer stacking method of claim 2, further comprising: fabricating a groove configured to form a second lower RDL while fabricating the through via.

4. The wafer stacking method of claim 3, further comprising:
sequentially fabricating the second lower RDL and a second upper RDL on the second wafer, wherein the second lower RDL comprises a third wiring connected to the first TSV and a fourth wiring connected to the second bonding pad, the second upper RDL comprises a fifth wiring connected to the third wiring and a sixth wiring connected to the fourth wiring, and the fifth wiring and the sixth wiring comprise a second landing pad and a third landing pad, respectively.

5. The wafer stacking method of claim 4, wherein a first distance between the first landing pad and the first bonding pad in a horizontal direction is equal to a third distance between the third landing pad and the first bonding pad in the horizontal direction, and neither the first distance or the third distance is zero.

6. The wafer stacking method of claim 2, further comprising:
sequentially fabricating the second lower RDL and a second upper RDL on the second wafer, wherein the second lower RDL comprises a third wiring connected to the first TSV and a fourth wiring connected to the second bonding pad, the second upper RDL comprises a fifth wiring connected to the third wiring and a sixth wiring connected to the fourth wiring, and the fifth wiring and the sixth wiring comprise a second landing pad and a third landing pad, respectively.

7. The wafer stacking method of claim 6, wherein a first distance between the first landing pad and the first bonding pad in a horizontal direction is equal to a third distance between the third landing pad and the first bonding pad in the horizontal direction, and neither the first distance or the third distance is zero.

8. The wafer stacking method of claim 1, further comprising:
sequentially fabricating the second lower RDL and a second upper RDL on the second wafer, wherein the second lower RDL comprises a third wiring connected to the first TSV and a fourth wiring connected to the second bonding pad, the second upper RDL comprises a fifth wiring connected to the third wiring and a sixth wiring connected to the fourth wiring, and the fifth wiring and the sixth wiring comprise a second landing pad and a third landing pad, respectively.

9. The wafer stacking method of claim 8, wherein a first distance between the first landing pad and the first bonding pad in a horizontal direction is equal to a third distance between the third landing pad and the first bonding pad in the horizontal direction, and neither the first distance or the third distance is zero.

10. A wafer stacking structure, comprising:
a first wafer, having an upper surface comprising a first bonding pad configured to connect to a first signal;
a first lower redistribution layer (RDL), located on the first wafer and comprising a first wiring electrically connected to the first bonding pad;
a first upper RDL, located on the first lower RDL and comprising a second wiring electrically connected to the first wiring, the second wiring having a first landing pad;
a second wafer, having a bottom bonded on the first upper RDL and comprising a second bonding pad configured to connect to a second signal and a first through silicon via (TSV) with a bottom directly connected to the first landing pad;
a second lower RDL, located on the second wafer and comprising a third wiring electrically connected to the first TSV and a fourth wiring electrically connected to the second bonding pad; and
a second upper RDL, located on the second lower RDL and comprising a fifth wiring electrically connected to the third wiring and a sixth wiring electrically connected to the fourth wiring, wherein the fifth wiring and the sixth wiring comprise a second landing pad and a third landing pad, respectively.

11. The wafer stacking structure of claim 10, wherein a first distance between the first landing pad and the first bonding pad in a horizontal direction is equal to a third distance between the third landing pad and the first bonding pad in the horizontal direction, and neither the first distance or the third distance is zero.

12. A die stacking method, comprising:
providing the wafer stacking structure of claim 11; and
scribing and cutting the wafer stacking structure to form a preset number of dies each having a stacking structure.

13. A die stacking method, comprising:
providing the wafer stacking structure of claim 10; and
scribing and cutting the wafer stacking structure to form a preset number of dies each having a stacking structure.

14. A die stacking structure, comprising:
a first die, having an upper surface comprising a first bonding pad configured to connect to a first signal;
a first lower redistribution layer (RDL), located on the first die and comprising a first wiring electrically connected to the first bonding pad;
a first upper RDL, located on the first lower RDL and comprising a second wiring electrically connected to the first wiring, the second wiring having a first landing pad;
a second die, having a bottom bonded on the first upper RDL and comprising a second bonding pad configured to connect to a second signal and a first through silicon via (TSV) with a bottom directly connected to the first landing pad;
a second lower RDL, located on the second die and comprising a third wiring electrically connected to the first TSV and a fourth wiring electrically connected to the second bonding pad; and
a second upper RDL, located on the second lower RDL and comprising a fifth wiring electrically connected to the third wiring and a sixth wiring electrically connected to the fourth wiring, wherein the fifth wiring and the sixth wiring comprise a second landing pad and a third landing pad, respectively.

15. The die stacking structure of claim 14, wherein a first distance between the first landing pad and the first bonding pad in a horizontal direction is equal to a third distance between the third landing pad and the first bonding pad in the horizontal direction, and neither the first distance or the third distance is zero.

16. A die stacking structure, comprising:
a base die structure and a plurality of upper die structures stacked over the base die structure, wherein the base die structure comprises:
a die, having an upper surface comprising a bonding pad configured to connected to a signal;
a lower redistribution layer (RDL), located on the die and comprising a first wiring electrically connected to the bonding pad; and
an upper RDL, located on the lower RDL and comprising a second wiring electrically connected to the first wiring, the second wiring having a landing pad,
and wherein each of the plurality of upper die structures comprises:
a die, having a bottom bonded with the upper RDL of the die structure underneath, and a through silicon via (TSV) with a bottom directly connected to the landing pad of the die structure underneath;
a lower RDL, located on the die and comprising a first wiring electrically connected to the TSV; and
an upper RDL, located on the lower RDL and comprising a second wiring electrically connected to the first wiring of the lower RDL, wherein the second wiring comprises a landing pad,
wherein the signal in the die of the base die structure is guided out to the landing pad of the uppermost upper die structure through N TSVs, wherein N is the number of upper die structures in the plurality of upper die structures.

* * * * *